United States Patent
Rohleder (10) Patent No.: US 7,245,544 B2
(45) Date of Patent: Jul. 17, 2007

(54) INTEGRATED SEMICONDUCTOR MEMORY DEVICE INCLUDING SENSE AMPLIFIERS

(75) Inventor: Markus Rohleder, München (DE)

(73) Assignee: Infineon Technologies, AG, Neubiberg (DE)

(*) Notice: Subject to any disclaimer, the term of this patent is extended or adjusted under 35 U.S.C. 154(b) by 74 days.

(21) Appl. No.: 11/260,499

(22) Filed: Oct. 28, 2005

(65) Prior Publication Data

US 2006/0092736 A1    May 4, 2006

(30) Foreign Application Priority Data

Oct. 29, 2004    (DE) ............... 10 2004 052 594

(51) Int. Cl.
G11C 7/02 (2006.01)
(52) U.S. Cl. ............... 365/207; 365/201
(58) Field of Classification Search ........ 365/207, 365/201, 189.04
See application file for complete search history.

(56) References Cited

U.S. PATENT DOCUMENTS

| | | | | |
|---|---|---|---|---|
| 4,464,750 A | * | 8/1984 | Tatematsu | 714/719 |
| 5,293,598 A | * | 3/1994 | Furutani et al. | 365/230.03 |
| 6,084,811 A | * | 7/2000 | Dorney | 365/208 |
| 6,826,111 B2 | | 11/2004 | Schneider et al. | |

* cited by examiner

*Primary Examiner*—Anh Phung
(74) *Attorney, Agent, or Firm*—Edell, Shapiro & Finnan, LLC

(57) ABSTRACT

An integrated semiconductor memory device includes a memory cell array with sense amplifiers that are combined in groups within the memory cell array. Each sense amplifier is associated with one data connection, the association varying on the basis of area within the memory cell array. When a memory cell is read, further adjacent memory cells besides the memory cell which is to be read are read, so that data are produced at all the data connections. To this end, the sense amplifiers in a group are activated together. To establish which sense amplifier within a group of sense amplifiers has a signaling connection to which data connection, individual sense amplifiers in a group can be deactivated specifically, which means that a data item which differs from an expected value appears at the data connection which is connected to the deactivated sense amplifier.

12 Claims, 5 Drawing Sheets

INTEGRATED SEMICONDUCTOR MEMORY DEVICE INCLUDING SENSE AMPLIFIERS

CROSS REFERENCE TO RELATED APPLICATIONS

This application claims priority under 35 USC §119 to German Application No. DE 10 2004 052 594.3, filed on Oct. 29, 2004, and titled "Integrated Semiconductor Memory," the entire contents of which are hereby incorporated by reference.

FIELD OF THE INVENTION

The invention relates to an integrated semiconductor memory device including sense amplifiers and to a method for testing an integrated semiconductor memory device including sense amplifiers.

BACKGROUND

Figure 3:
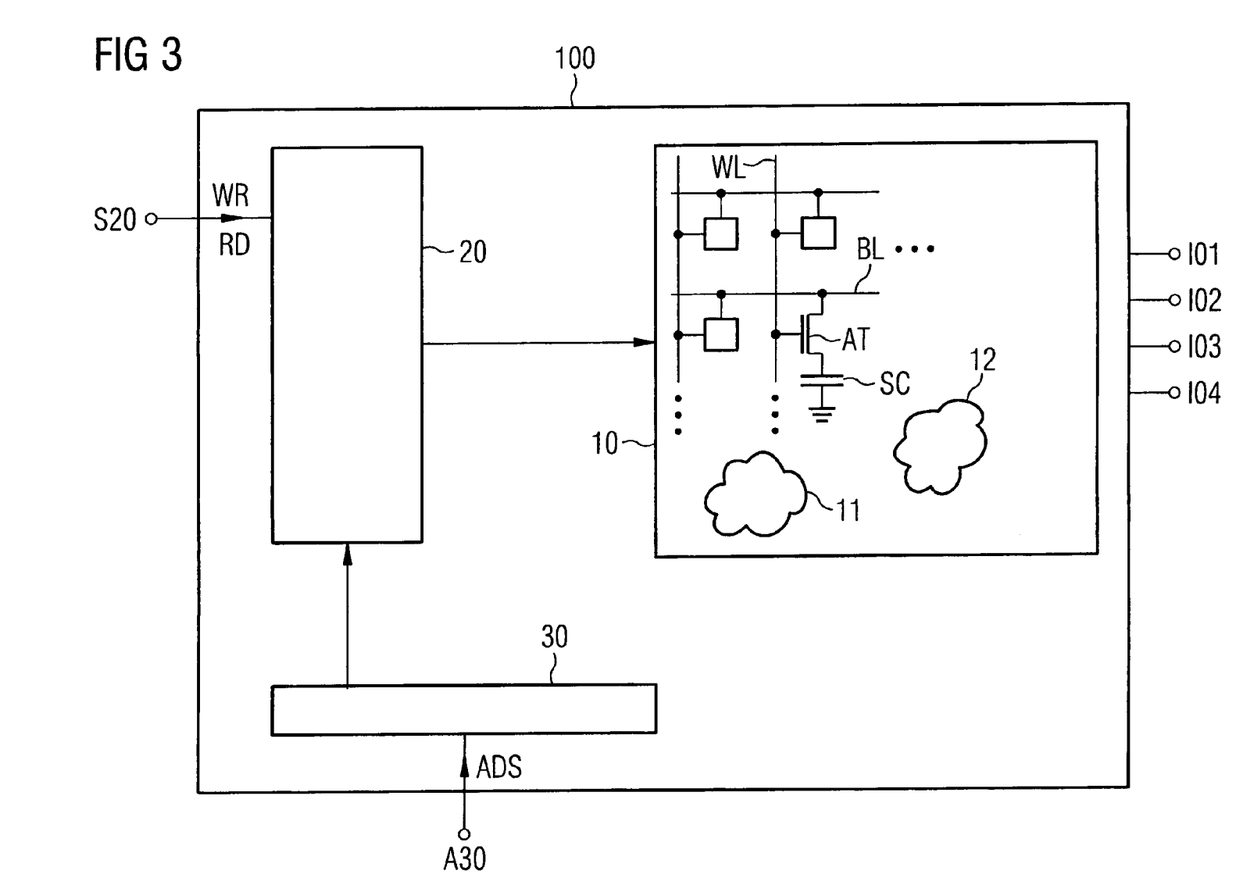
FIG. 3 depicts an integrated semiconductor memory device whose association between data connections and bit lines/sense amplifiers within a memory cell array differs on the basis of area.

Integrated semiconductor memories, for example DRAM (dynamic random access memory) semiconductor memories, have a memory cell array in which memory cells are connected to word lines and bit lines. FIG. 3 shows a simplified illustration of an integrated semiconductor memory device 100 having a memory cell array 10. The memory cell array 10 includes word lines WL and bit lines BL to which memory cells SZ are respectively connected. FIG. 3 shows an example of a DRAM memory cell which includes a selection transistor AT and a storage capacitor SC. To control read and write access to the memory cells in the memory cell array, the memory cell array is actuated by a control circuit 20 on the basis of control signals which are applied to a control connection S20 of the control circuit 20. The integrated semiconductor memory device also includes an address register 30 with an address connection A30 to apply address signals.

To select a memory cell in the memory cell array for read and write access, the address associated with the memory cell is applied to the address register 30 by the address signal ADS. In the event of write access to the memory cell SZ, a write command WR is applied to the control connection S20 of the control circuit 20. The word line WL is then actuated by the control circuit 20 using a signal level which switches the selection transistor AT to an on state, so that the storage capacitor SC is connected at low impedance to the bit line BL via the activated path in the selection transistor. If it is possible to write to the memory cell SZ via the data connection IO1, the appropriate memory information can be written to the memory cell SZ by applying a data signal to the data connection IO1.

For read access to the memory cell SZ, a read command RD is applied to the control connection S20 of the control circuit 20 after the appropriate address signal has been applied to the address register 30. The control circuit 20 then actuates the word line WL again such that the selection transistor AT is turned on. The storage capacitor SC can now be discharged to the bit line BL via the controllable path in the selection transistor. If the bit line BL was charged to a precharge potential before the memory cell SZ was activated, a change in potential from the precharge potential appears on the bit line, depending on the charge state of the storage capacitor SC, and this change in potential is amplified by a sense amplifier and is supplied to the data connection IO1.

Figure 1:
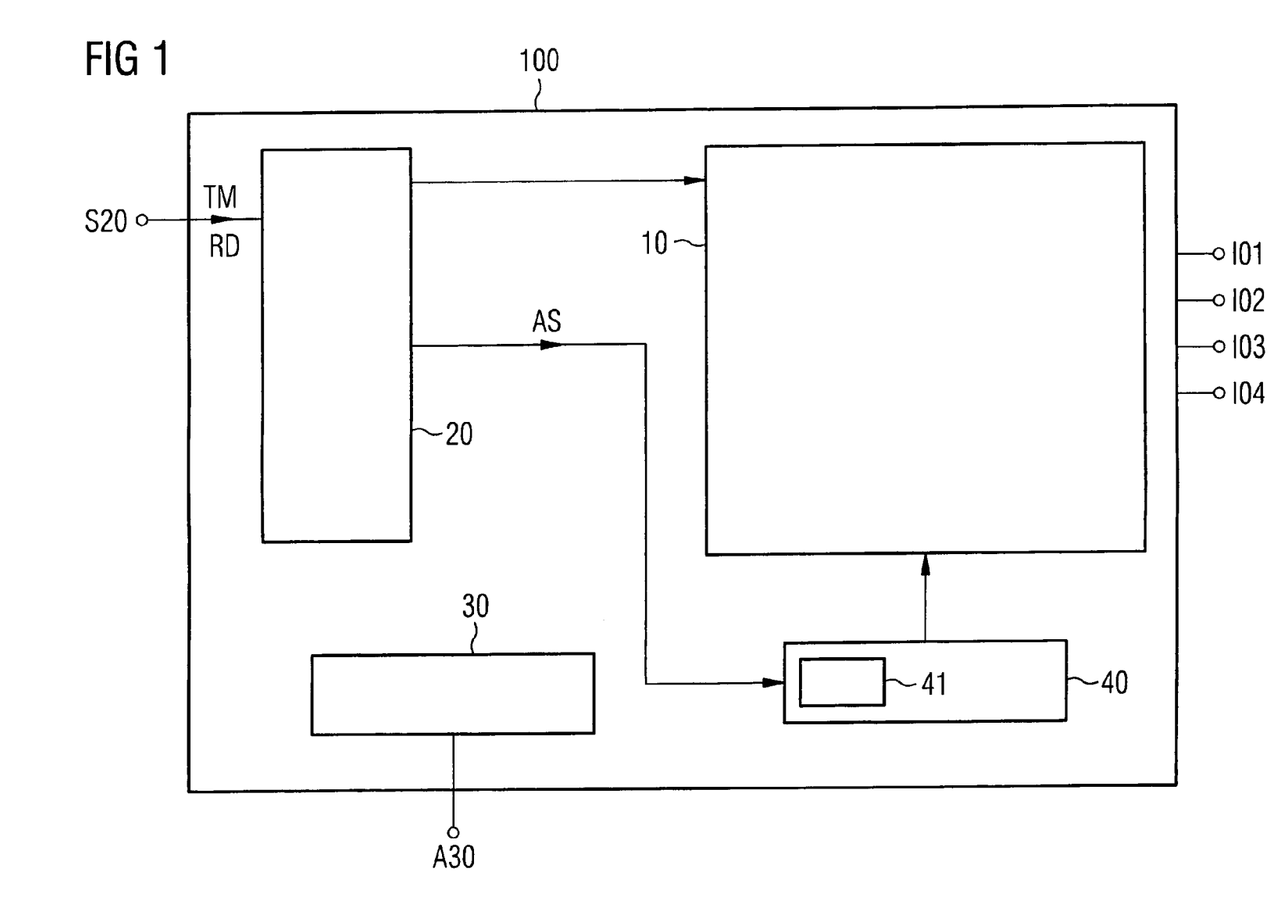
FIG. 1 depicts an embodiment of an integrated semiconductor memory device for verifying scrambling of bit lines/sense amplifiers relative to data connections in accordance with the invention.
Figure 4A:
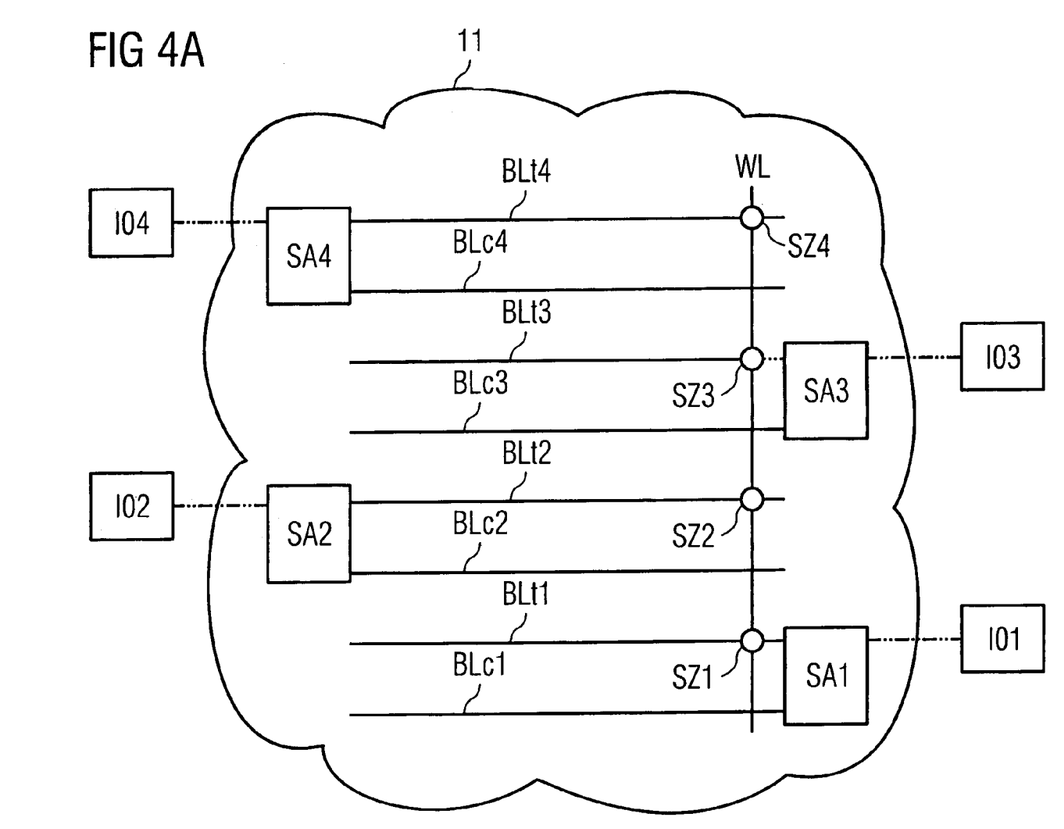
FIG. 4A depicts an enlarged view in detail from the memory cell array of FIG. 3 with bit lines/sense amplifiers that are associated with data connections.

FIG. 4A shows a first group 11 of sense amplifiers in a region of the memory cell array 10 in FIG. 1 in an enlarged illustration. For reasons of better clarity, the memory cells SZ1, SZ2, SZ3 and SZ4 are shown at crossing points between the bit lines BLt1, BLt2, BLt3 and BLt4 and a word line WL. The bit lines are in the form of bit line pairs BLt1-BLc1, BLt2-BLc2, BLt3-BLc3 and BLt4-BLc4. Each of the bit line pairs is connected to a respective sense amplifier. The bit line pair BLt1-BLc1 is connected to the sense amplifier SA1, the bit line pair BLt2-BLc2 is connected to the sense amplifier SA2, the bit line pair BLt3-BLc3 is connected to the sense amplifier SA3 and the bit line pair BLt4-BLc4 is connected to the sense amplifier SA4. The sense amplifiers and their connected bit line pairs have the data connections IO1, . . . , IO4 respectively associated with them. In the example in FIG. 4A, the sense amplifier SA1 has the associated data connection IO1, the sense amplifier SA2 has the associated data connection IO2, the sense amplifier SA3 has the associated data connection IO3 and the sense amplifier SA4 has the associated data connection IO4. The sense amplifiers are connected to their associated data connections via circuit components (not shown), such as a secondary sense amplifier. If the memory cell SZ1 is to be read, for example, the sense amplifier SA1 produces a corresponding signal at the data connection IO1. Accordingly, the sense amplifier SA2 produces an output signal at the data connection IO2 when the memory cell SZ2 is read, the sense amplifier SA3 produces an output signal at the data connection IO3 when the memory cell SZ3 is read and the sense amplifier SA4 produces an output signal at the data connection IO4 when the memory cell SZ4 is read.

For read access to a memory cell, all the other memory cells which are connected to the same word line are simultaneously also connected at low impedance to the bit lines which are connected to them. If, by way of example, the memory cell SZ1 is actuated by an appropriate signal level on the word line WL, not only is the selection transistor for the memory cell SZ1 turned on but also the selection transistors for the memory cells SZ2, SZ3 and SZ4 are simultaneously switched to the on state.

For read access to the memory cell SZ1, not just the sense amplifier SA1 is now activated but also further sense amplifiers in addition, however, depending on the form of organization of the semiconductor memory. For the ×4 form of organization, access to a single memory cell, for example, involves the memory information from 4 adjacent memory cells or 4 adjacent bit line pairs being simultaneously output at the data connections. Hence, in FIG. 4A, read access to the memory cell SZ1 involves not just the sense amplifier SA1 being activated but, in addition, the sense amplifiers SA2, SA3 and SA4, which means that besides the memory content of the memory cell SZ1 at the data connection IO1 it is also possible to tap off the memory contents of the memory cells SZ2, SZ3 and SZ4 at the data connections IO2, IO3 and IO4.

In the case of an ×8 form of organization, a further 7 sense amplifiers are activated in addition to the sense amplifier which is connected by its connected bit line to the memory cell which is to be read, which means that signals are produced simultaneously at a total of 8 data connections. Accordingly, in the case of the ×16 form of organization, 16 sense amplifiers are simultaneously activated and hence 16 output signals are produced at 16 data connections.

Figure 4B:
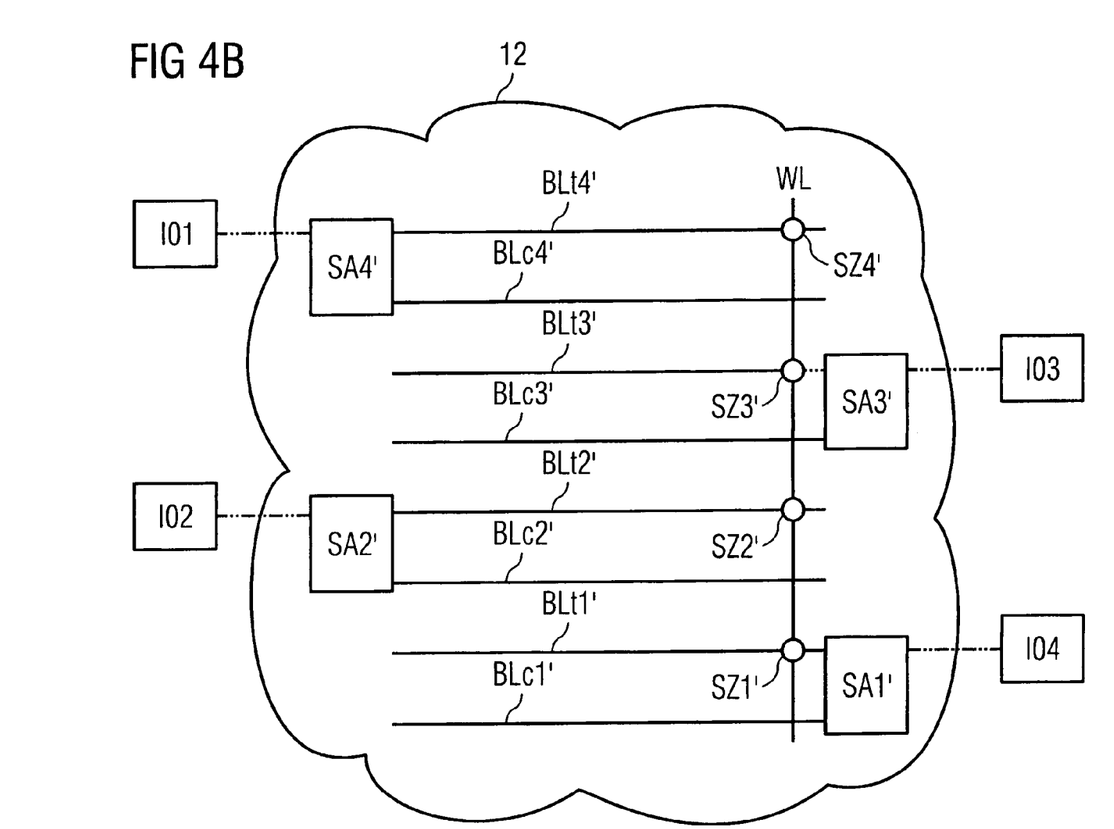
FIG. 4B depicts another enlarged view in detail from the memory cell array of FIG. 3 with bit lines/sense amplifiers that are associated with data connections.

FIG. 4B shows a further region in the memory cell array 10 with a second group 12 of sense amplifiers from FIG. 1 in an enlarged illustration. The sense amplifiers in the second group are arranged relative to the bit line pairs in a similar manner to the sense amplifiers in the first group. The sense amplifier SA1' is connected to a bit line pair BLt1'-BLc1', the sense amplifier SA2' is connected to a bit line pair BLt2'-BLc2', the sense amplifier SA3' is connected to a bit line pair BLt3'-BLc3' and the sense amplifier SA4' is connected to a bit line pair BLt4'-BLc4'. Unlike in the first group 11 of sense amplifiers as shown in FIG. 4A, the sense amplifiers in the second group 12 and hence also the bit line pairs are associated with other data connections, however. The memory state of the memory cell SZ1 whose memory content is amplified by the sense amplifier SA1 is read at the data connection IO4 and no longer as in FIG. 4A at the data connection IO1. The sense amplifier SA4 no longer has a signaling connection to the data connection IO4, but rather has a signaling connection to the data connection IO1.

FIGS. 4A and 4B illustrate that the association between the data connections and the sense amplifiers or the bit lines connected to the sense amplifiers differs on the basis of area within the cell array. Such area-based transpositions between data connections and a group of sense amplifiers are generally made to make the layout of the circuit as efficient as possible.

The area-based transposition of sense amplifiers relative to data connections in various groups of sense amplifiers is a problem when the semiconductor memory is tested. Error mechanisms in semiconductor memories are heavily dependent on topology. To reveal particular errors, the memory cell array in a semiconductor memory is therefore described using a particular data topology on the basis of the respective production test. The use of another topology within the same production test can result in the test becoming totally uncritical toward the error mechanism which is actually of interest and as a result errors ultimately not being revealed.

To be able to describe the memory cell array during a function test using a particular data topology which is characteristic of a type of error, the association between the data connections and the sense amplifiers or the bit lines and memory cells in the memory cell array, known as scrambling, needs to be known. This is the only way of allowing particular bit sequences to be applied to the data connections, said bit sequences then resulting in the storage of a desired error-critical data topology within the memory cell array.

Within the physical error analysis for a semiconductor memory, the scrambling is currently verified by deliberately damaging bit lines. When a memory cell which is connected to the damaged bit line is read, not only this memory cell but also further adjacent memory cells are read at the data connections, as described above. If it is assumed that the adjacent memory cells are connected to sound bit lines and sense amplifiers, the correct data value stored in the respective memory cells is produced at all the data connections. At the data connection which is connected to the damaged bit line, however, a data item will be produced which differs from the expected value. By damaging further bit lines within a group of sense amplifiers it is thus possible to establish successively which bit line or which sense amplifier within a group of sense amplifiers is connected to which of the data connections. When the scrambling on a mask is known fully in this way, all the semiconductor memories which have been produced with this mask can be described in a production test using the desired critical data topologies.

The drawback of the current method for verifying the scrambling described is that semiconductor memories become unusable as a result of the deliberate damage to bit lines. Besides the bit lines, the circuit components or metal layers situated above them in the layout are also destroyed.

A further drawback is that the method is very time-consuming on account of the deliberate damage to individual structures.

SUMMARY OF THE INVENTION

An object of the present invention is to provide an integrated semiconductor memory device in which the association between data connections and the bit lines or sense amplifiers can easily be verified.

Another object of the present invention is to provide a method which allows the association between data connections and the bit lines or sense amplifiers to be verified easily.

The aforesaid objects are achieved individually and/or in combination, and it is not intended that the present invention be construed as requiring two or more of the objects to be combined unless expressly required by the claims attached hereto.

In accordance with the present invention, an integrated semiconductor memory device is operable in a normal operating state and in a test operating state. The integrated semiconductor memory device comprises at least one control circuit to control the integrated semiconductor memory device in the normal operating state and in the test operating state, and also data connections, memory cells and sense amplifiers that are combined in groups. A respective one of the sense amplifiers can be connected to a respective one of the memory cells in order to access one of the memory cells. A respective one of the sense amplifiers can be activated in order to access a respective one of the memory cells. In addition, a respective one of the sense amplifiers in the activated state is connected to a respective one of the data connections. The control circuit is configured such that, in the normal operating state of the integrated semiconductor memory device, when one of the memory cells is accessed, it activates a first instance of the sense amplifiers, which is connected to the one of the memory cells, and likewise activates further instances of the sense amplifiers, which are combined with the first of the sense amplifiers in the same group. In addition, the control circuit is configured such that, in the test operating state of the integrated semiconductor memory device, when the one of the memory cells is accessed, it activates the first of the sense amplifiers and optionally deactivates one of the further instances of the sense amplifiers, which is combined with the first of the sense amplifiers in the same group, and activates all the rest of the further instances of the sense amplifiers, which are combined with the first of the sense amplifiers in the same group.

In the test operating state, sense amplifiers can thus be deactivated specifically within a group of sense amplifiers. At the data connection connected to the deactivated sense amplifier, a data item thus appears which differs from the expected value. If a respective sense amplifier is successively deactivated within a group of sense amplifiers, it can be inferred which sense amplifier has a signaling connection to which data connection.

In one embodiment, the integrated semiconductor memory device includes a memory unit to store a bit sequence. The control circuit is further configured such that, in the test operating state of the integrated semiconductor memory device, when the one of the memory cells is accessed, it reads the bit sequence stored in the memory unit and deactivates one of the further instances of the sense amplifiers on the basis of the bit sequence which has been read.

This makes it possible to stipulate, for a test on the integrated semiconductor memory device, that sense amplifier which is deactivated within a group of sense amplifiers. The stored bit sequences within the memory unit can also contain information about the order in which the sense amplifiers in a group are deactivated during a function test to reveal the scrambling.

In accordance with another embodiment of the invention, the integrated semiconductor memory device includes switching transistors, and the sense amplifiers can be connected at low impedance or at high impedance via a respective one of the switching transistors to the bit line which is respectively connected to them. In this embodiment, the sense amplifier is deactivated by virtue of it being connected at high impedance by its connected bit line by turning off the switching transistor, or by virtue of it being isolated from the connected bit line according to the blocking capability of the switching transistor.

In accordance with a further embodiment of the invention, the integrated semiconductor memory device includes controllable switches. A respective one of the sense amplifiers can be connected to a first voltage potential via a respective first state of the controllable switches and to a second voltage potential via a second state of the controllable switches. The sense amplifiers in the activated state are respectively connected to the first voltage potential via the first of the controllable switches and to the second voltage potential via the second of the controllable switches. In the deactivated state, the sense amplifiers are respectively isolated from the first voltage potential and from the second voltage potential.

In yet another embodiment of the invention, a method for testing an integrated semiconductor memory device comprises using an integrated semiconductor memory device that includes memory cells, data connections and sense amplifiers that are combined in groups, where a respective one of the memory cells can be connected to a respective one of the sense amplifiers via a respective bit line, and a respective one of the sense amplifiers can be connected to one of the data connections, and where a respective one of the sense amplifiers can be activated in order to access a respective one of the memory cells. A respective data item is written to a respective one of the memory cells, which can be connected to a respective one of the sense amplifiers that are combined in one of the groups. To perform subsequent read access, an address is applied in order to select the one of the memory cells. A first instance of the sense amplifiers is then connected to the selected instance of the memory cells via the one of the bit lines. The first of the sense amplifiers is then connected to a first instance of the data connections. Further instances of the sense amplifiers which are combined with the first of the sense amplifiers in the same group are then connected to a respective one of the memory cells via a respective one of the bit lines. In addition, the further instances of the sense amplifiers are also connected to a respective further instance of the data connections. The first of the sense amplifiers is then activated for read access to the selected instance of the memory cells. One of the further instances of the sense amplifiers which is combined with the first of the sense amplifiers in the same group is then deactivated, whereas the rest of the further instances of the sense amplifiers are activated for read access to the memory cells which are connected to the rest of the further instances of the sense amplifiers. The data produced in the data connections are then read at the data connections.

The method is thus a nondestructive test method which can be used to test or verify which sense amplifier in a group of sense amplifiers has a signaling connection to which data connection.

One embodiment of the method provides for the use of the integrated semiconductor memory device including a memory unit. At least one bit sequence is written to the memory unit. One of the further sense amplifiers is then deactivated on the basis of the bit sequence written to the storage register.

The above and still further objects, features and advantages of the present invention will become apparent upon consideration of the following detailed description of specific embodiments thereof, particularly when taken in conjunction with the accompanying drawings where like numerals designate like components.

DETAILED DESCRIPTION

FIG. 1 shows an integrated semiconductor memory device in which the association between bit lines/sense amplifiers in an area of the memory cell array and data connections can be verified by using a nondestructive test method. In addition to the memory cell array 10, the control circuit 20 and the address register 30 already described above with reference to FIG. 3, the semiconductor memory device of FIG. 1 further includes a test mode control circuit 40 with a memory unit 41. The memory unit 41 can be programmed with a bit sequence. The test mode circuit 40 is activated by the control circuit 20 using an activation signal AS when the control connection S20 of the control circuit 20 is actuated by a test mode signal TM. The integrated semiconductor memory device is then controlled by the test mode control circuit 40. In the test operating state, the memory unit 41 can be programmed by applying a bit sequence to the data or address connections.

Figure 2:
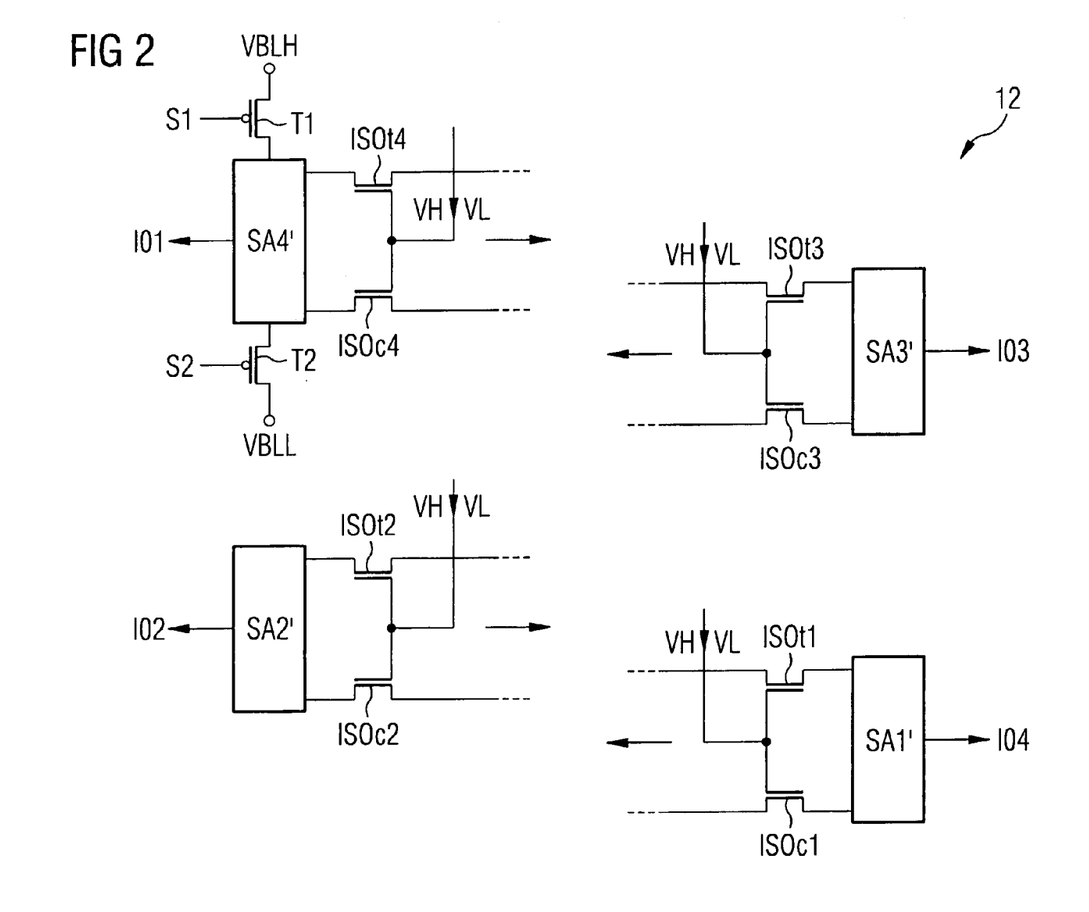
FIG. 2 depicts a group of sense amplifiers from an area in a memory cell array In accordance with the invention.

FIG. 2 shows the sense amplifiers in the second group 12 of the memory cell array with their connected bit lines in an enlarged illustration. The sense amplifiers are connected to their respective bit line pairs via respective switching transistors ISOt and ISOc. The switching response of the switching transistors can be controlled by actuating the control inputs of the switching transistors with control signals VH and VL which are supplied to the memory cell array by the test mode control circuit 40.

In the activated state, the sense amplifier, when writing a piece of information to a memory cell, amplifies a potential level that is supplied to it by the data connection, and writes it to a connected memory cell. In the case of read access, it amplifies the potential level which appears on its connected bit line when a memory cell is read, and forwards the amplified level to the respective connected data connection.

In a further embodiment, the sense amplifiers are connected via a controllable switch T1 to a connection that applies a high voltage potential VBLH and via a second controllable switch T2 to a connection that applies a low voltage potential VBLL. The controllable switches are respectively in the form of switching transistors. For the sake of simplicity, in FIG. 2 it is possible to connect only the sense amplifier SA4 to the voltage potentials VBLH and VBLL via the switching transistors T1 and T2. When a binary "1" is stored in a memory cell, the sense amplifier amplifies the signal level to the full high VBLH level and feeds this voltage level to the bit lines via the switching transistors ISOt. When a binary "1" is read from a memory cell, the sense amplifier transfers the high voltage level VBLH to its associated data connection. In the other case, when a binary "0" is written to a memory cell, the sense amplifier feeds the low VBLL level to the bit line. When a binary "0" is read from a memory cell, the sense amplifier transfers the low voltage level VBLL to its associated data connection. The sense amplifiers can be activated and deactivated by the test mode control circuit 40 by actuating their respective switching transistors T1 and T2 with a level of the control signals S1 and S2. In the activated state, the voltage potentials VBLH and VBLL are supplied to the sense amplifiers via the switching transistors. In the deactivated state of a sense amplifier, the switching transistors are by contrast off.

In the test operating state of the integrated semiconductor memory device, the invention allows one of the sense amplifiers from the group of sense amplifiers, which are all activated during normal operation, to be specifically deactivated. A respective different instance of the sense amplifiers in the group can then be deactivated, whereas the rest of the sense amplifiers are activated.

The integrated semiconductor memory device can be switched to the test operating state by applying the test mode control signal TM to the control connection S20 of its control circuit 20. By writing a bit sequence which, in the test operating state, is applied to the address connection A30 of the address register or to the data connections IO1, . . . , IO4, it is possible to establish which of the sense amplifiers is deactivated within a test cycle. The written bit sequence can also be used to establish the order in which the sense amplifiers in a group are deactivated.

When the read command RD is applied to the control circuit 20 in the test operating state, the test mode control circuit 40 is activated by the control circuit 20 using the activation signal AS. By applying an address signal ADS to the address connection A30 of the address register 30, it is possible to select a particular memory cell in the memory cell array 10 for read access.

During the subsequently effected read access, all the sense amplifiers apart from one sense amplifier are activated which are combined in a common group with the sense amplifier which is connected to the memory cell which is to be read. Within this group, specifically that sense amplifier which is associated with the bit sequence stored in the memory unit 41 is deactivated.

In a first embodiment, a sense amplifier is deactivated by virtue of it being isolated from its connected bit line pair by the switching transistors ISO or by virtue of it being connected to the bit line pair at high impedance. To this end, the control connections of the switching transistors ISOt and IOSc are actuated with the control signal VL from the test mode control circuit 40. The further sense amplifiers in a group remain activated. To this end, the control connections of the switching transistors ISOt and ISOc are actuated by the control circuit 40 using a voltage potential VH. If the switching transistors are in the form of n-channel field effect transistors, the voltage potential VH has a higher level than the voltage potential VL. It is thus possible to deactivate individual sense amplifiers in a group specifically.

In line with the invention, in a second embodiment, access to a memory cell involves the individual sense amplifiers in the group being specifically deactivated in succession by turning off the switching transistors T1 and T2 which are to be deactivated. To this end, the test mode control circuit 40 actuates the switching transistors of one of the sense amplifiers in a group such that the latter are turned off and hence the sense amplifier is isolated from the voltage potentials VBLH and VBLL. The further sense amplifiers in the group remain in the activated state by virtue of them continuing to be connected to the voltage potentials VBLH and VBLL via their switching transistors which are on.

If, by way of example, the sense amplifier SA4' shown in FIG. 2 is deactivated on the basis of the first or the second embodiment and the further sense amplifiers SA1' and SA2' and SA3' continue to remain activated, the data connection IO1 produces a data item which does not match the expected value. From this, the information is obtained that the data connection IO1 is connected to the deactivated sense amplifier, in the example the sense amplifier SA4'. By specifically deactivating further sense amplifiers, it is possible to associate the sense amplifiers in a group with the external data connections.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

10 memory cell array
11, 12 group of sense amplifiers
20 control circuit
30 address register
40 test mode control circuit
41 register
S control connection
WR write signal
RD read signal
IO data connection
WL word line
BL bit line
SZ memory cell
AT selection transistor
SC storage capacitor
ADS address signal
ISO switching transistor sense amplifiers/bit line
T switching transistor sense amplifiers/bit line potential
SA sense amplifier
VH, VL control voltages

What is claimed:

1. An integrated semiconductor memory device that can be operated in a normal operating state and in a test operating state, the integrated semiconductor memory device comprising:
   at least one control circuit to control the integrated semiconductor memory device in the normal operating state and in the test operating state;
   a plurality of data connections;
   a plurality of memory cells; and
   a plurality of sense amplifiers that are combined in groups, wherein each sense amplifier is connectable to a respective memory cell in order to access the respective memory cell, each sense amplifier is configured to be activated in order to access the respective memory cell, and each sense amplifier in the activated state is connected to a respective data connection;
   wherein:
      the control circuit is configured such that, in the normal operating state of the integrated semiconductor memory device, when one of the memory cells is accessed, the control circuit activates a respective first sense amplifier that is connected to the one of the memory cells, and further activates a selected number of additional sense amplifiers that are combined in the same group with the first sense amplifier; and
      the control circuit is further configured such that, in the test operating state of the integrated semiconductor memory device, when the one of the memory cells is accessed, the control circuit activates the first sense amplifier.

2. The integrated semiconductor memory of claim 1, wherein, upon activation of the first sense amplifier by the control circuit in the test operating state, the control circuit is further configured to deactivate one of the sense amplifiers that is combined in the same group with the first sense amplifier, and to activate all of the other sense amplifiers that are combined in the same group with the first sense amplifier.

3. The integrated semiconductor memory device of claim 1, wherein the integrated semiconductor memory device is operable in one of a plurality of selectable forms of organization for data outputs, each selected form of organization being used to stipulate a number of data bits provided in parallel at the data connections, and the control circuit is further configured such that the selected number of the additional sense amplifiers that are combined in the same group with the first sense amplifier and are activated by the control circuit in the normal operating state of the integrated semiconductor memory device is dependent on the selected form of organization for data outputs.

4. The integrated semiconductor memory device of claim 2, further comprising:
   a memory unit configured to store a bit sequence;
   wherein the control circuit is further configured such that, in the test operating state of the integrated semiconductor memory device, when the one of the memory cells is accessed, the control unit reads the bit sequence stored in the memory unit and deactivates the one of the further sense amplifiers that is combined in the same group with the first sense amplifier based upon the bit sequence that has been read.

5. The integrated semiconductor memory device of claim 2, further comprising:
   a plurality of bit lines;
   wherein:
      each of the memory cells is connected to a respective one of the bit lines, and each of the sense amplifiers is connectable at low impedance or at high impedance to a respective one of the bit lines;
      the control circuit is further configured such that, in the normal operating state of the integrated semiconductor memory device, when the one of the memory cells is accessed, the control unit connects the first sense amplifier at low impedance to the respective bit line that is connected to the first sense amplifier and connects the additional sense amplifiers that are combined in the same group with the first sense amplifier at low impedance to the respective bit lines that are connected to each of the additional sense amplifiers; and
      the control circuit is further configured such that, in the test operating state of the integrated semiconductor memory device, when the one of the memory cells is accessed, the control unit connects the first sense amplifier at low impedance to the respective bit line that is connected to the first sense amplifier and further connects the one of the sense amplifiers that is combined in the same group with the first sense amplifier at high impedance to the respective bit line connected to the one of the sense amplifiers and connects all of the other sense amplifiers that are combined in the same group with the first sense amplifier at low impedance to the respective bit lines that are connected to all of the other sense amplifiers.

6. The integrated semiconductor memory device of claim 5, further comprising:
   a plurality of switching transistors;
   wherein each of the sense amplifiers is connectable at low impedance or at high impedance via a respective one of the switching transistors to the respective bit line that is connected to each sense amplifier.

7. The integrated semiconductor memory device of claim 1, further comprising:
   A plurality of controllable switches;
   wherein:
      each sense amplifier is connectable to a first voltage potential via a respective first one of the controllable switches and is further connectable to a second voltage potential via a second one of the controllable switches;
      the sense amplifiers in the activated state are respectively connected to the first voltage potential via the first one of the controllable switches and are further connected to the second voltage potential via the second one of the controllable switches; and
      the sense amplifiers in the deactivated state are respectively isolated from the first voltage potential and from the second voltage potential.

8. The integrated semiconductor memory device of claim 7, wherein the switching transistors and the controllable switches comprise field effect transistors.

9. A method for testing an integrated semiconductor memory device, comprising:
   providing an integrated semiconductor memory device including a plurality of memory cells, a plurality of data connections, and a plurality of sense amplifiers that are combined in groups, wherein each memory cells is connectable to a respective sense amplifier via a respective bit line, each sense amplifier is connectable to a respective data connection, and each sense amplifier is configured to be activated in order to access the respective memory cell;

writing a data item to one of the memory cells that is connectable to a respective sense amplifier that is in a combined group of sense amplifiers;

applying an address in order to select the one of the memory cells for read access;

connecting a respective first sense amplifier to the one of the memory cells via the respective bit line;

connecting the first sense amplifier to a respective data connection;

connecting further sense amplifiers that are combined in the same group with the first sense amplifier to the respective memory cells and via respective bit lines of the further sense amplifiers;

connecting the further sense amplifiers that are combined in the same group with the first sense amplifier to respective data connections of the further sense amplifiers;

activating the first sense amplifier in order to read access the one of the memory cells;

deactivating one of the further sense amplifiers that are combined in the same group with the first sense amplifier;

activating all of the other sense amplifiers that are combined in the same group with the first sense amplifier so as to read access the respective memory cells that are connected to all of the other sense amplifiers that are combined in the same group with the first sense amplifier; and reading data at the data connections.

10. The method of claim 9, further comprising:

writing at least one data item to at least one respective memory cell by applying a respective data item to a respective data connection;

applying an address in order to select the one of the memory cells for write access;

connecting the first sense amplifier to the one of the memory cells via the respective bit line of the first sense amplifier;

connecting the first sense amplifier to the respective data connection of the first sense amplifier;

connecting further sense amplifiers that are combined in the same group with the first sense amplifier to respective memory cells via respective bit lines of the further sense amplifiers;

connecting the further sense amplifiers that are combined in the same group with the first sense amplifier to respective data connections of the further sense amplifiers; and activating the first sense amplifier and the further sense amplifiers that are combined in the same group with the first sense amplifier in order to write the at least one data item applied to the respective data connection to the one of the memory cells and to further memory cells.

11. The method of claim 9, further comprising:

providing a memory unit for the integrated semiconductor memory device;

writing at least one bit sequence to the memory unit; and deactivating one of the further sense amplifiers that is combined in the same group with the first sense amplifier on the basis of the bit sequence written to the memory unit.

12. The method of claim 9, further comprising:

connecting one of the sense amplifiers at low impedance in the activated state of the one of the first sense amplifiers to the respective bit line that is connected to the one of the sense amplifiers; and connecting another of the sense amplifiers at high impedance in the deactivated state of the another of the sense amplifiers to the respective bit line that is connected to the another of the sense amplifiers.

* * * * *